United States Patent
Marr

(10) Patent No.: US 6,330,195 B2
(45) Date of Patent: Dec. 11, 2001

(54) BIAS GENERATOR FOR A FOUR TRANSISTOR LOAD LESS MEMORY CELL

(75) Inventor: Ken W. Marr, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/732,633

(22) Filed: Dec. 8, 2000

Related U.S. Application Data

(62) Division of application No. 09/338,393, filed on Jun. 22, 1999, now Pat. No. 6,198,670.

(51) Int. Cl.[7] .................................................. G11C 16/04
(52) U.S. Cl. ................................ 365/189.09; 365/230.06
(58) Field of Search ......................... 365/189.09, 189.11, 365/201, 230.06, 154; 327/538, 540, 512, 513

(56) References Cited

U.S. PATENT DOCUMENTS

| | | |
|---|---|---|
| 4,623,989 | 11/1986 | Blake . |
| 4,653,025 | 3/1987 | Minato et al. . |
| 4,740,918 | 4/1988 | Okajima et al. . |
| 4,796,227 | 1/1989 | Lyon et al. . |
| 5,023,835 | 6/1991 | Akimoto et al. . |
| 5,117,390 | 5/1992 | Akimoto et al. . |
| 5,255,225 | 10/1993 | Nambu et al. . |
| 5,255,230 * | 10/1993 | Chan et al. ............................ 365/201 |
| 5,453,949 | 9/1995 | Wiedmann et al. . |
| 5,521,861 | 5/1996 | Lee et al. . |
| 5,568,435 * | 10/1996 | Marr ..................................... 365/201 |
| 5,745,415 * | 4/1998 | Marr ..................................... 365/201 |
| 5,771,190 | 6/1998 | Okamura . |
| 5,838,192 | 11/1998 | Bowers et al. . |
| 5,852,572 | 12/1998 | Jung et al. . |
| 5,881,010 * | 3/1999 | Artieri .................................. 365/222 |
| 5,936,911 | 8/1999 | Inaba . |
| 5,982,701 * | 11/1999 | Eto ..................................... 365/230.06 |
| 5,994,945 | 11/1999 | Wu et al. . |

(List continued on next page.)

OTHER PUBLICATIONS

Lyon et al. "CMOS Static Memory with a New Four–Transistor Memory Cell", Schlumberger Palo Alto Research, Palo Alto, California, pp. 111–132, Jul. 9, 1987.*

Noda, K., et al., "A 1.9–μm2 Loadless CMOS Four–Transistor SRAM Cell in a 0.18–μm Logic Technology," ULSI Device Development Laboratories, (Japan), 643–647, (1998).

Losleben, Paul, "Proceedings of the 1987 Standord Conference," Advanced Research in VLSI, The MIT Press (Cambridge, Massachusetts), p. 107–132, (Jul. 9, 1987).

*Primary Examiner*—Vu A. Le
*Assistant Examiner*—Anh Phung
(74) *Attorney, Agent, or Firm*—Thorp Reed & Armstrong, LLP

(57) ABSTRACT

The present invention is a current-mirror-based bias generator for a load less four transistor SRAM as well as associated methods of controlling or modifying the current conducted by the access transistors of such an SRAM. The present invention may be thought of as an adjustable temperature coefficient, bias generator that references, via a current mirror, a reference bank of SRAM cells. The bank of reference cells provides an indication of the necessary conduction characteristics (e.g., gate to source voltage) of the access transistors under various conditions. By applying a bias voltage to the word line the desired current is sourced from the digit line. The bank of reference SRAM cells inherently compensates for process variations. The adjustable temperature coefficient bias generator allows the current sourced by the digit lines to vary greatly as a result of temperature variations. Thus, the present invention compensates for both process variations and temperature variations.

31 Claims, 5 Drawing Sheets

U.S. PATENT DOCUMENTS

| | | |
|---|---|---|
| 6,020,786 | 2/2000 | Ashby . |
| 6,067,269 * | 5/2000 | Han et al. ............................. 365/226 |
| 6,081,464 * | 6/2000 | Marr ..................................... 365/201 |
| 6,087,820 | 7/2000 | Houghton et al. . |
| 6,212,124 * | 4/2001 | Noda ............................... 365/230.06 |
| 6,222,780 * | 4/2001 | Takahashi ....................... 365/189.09 |

* cited by examiner

BIAS GENERATOR FOR A FOUR TRANSISTOR LOAD LESS MEMORY CELL

This application is a divisional of U.S. patent application Ser. No. 09/338,393 filed Jun. 22, 1999, now U.S. Pat. No. 6,198,670 issued Mar. 6, 2001.

BACKGROUND OF THE INVENTION

1. Field of the Invention

The invention relates generally to static-random-access-memory (SRAM) devices and, more particularly, to SRAM's utilizing a four transistor design.

2. Description of the Background

To meet customer demand for smaller and more power efficient integrated circuits (ICs), manufacturers are designing newer ICs that operate with lower supply voltages and that include smaller internal subcircuits such as memory cells. Many ICs, such as memory circuits or other circuits such as microprocessors that include onboard memory, include arrays of SRAM cells for data storage. SRAM cells are popular because they operate at a higher speed than dynamic-random-access-memory (DRAM) cells, which must be periodically refreshed.

FIG. 1 is a circuit diagram of a conventional 6-transistor (6-T) SRAM cell 10, which can operate at a relatively low supply voltage, for example 1.5V–3.3V, but which is relatively large. A pair of NMOS access transistors 12 and 14 allow complementary bit values D and $\overline{D}$ on digit lines 16 and 18, respectively, to be read from and to be written to a storage circuit 20 of the cell 10. The storage circuit 20 includes NMOS pulldown transistors 22 and 26, which are coupled in a positive-feedback configuration with PMOS pull-up transistors 24 and 28, respectively. Nodes A and B are the complementary inputs/outputs of the storage circuit 20, and the respective complementary logic values at these nodes represent the state of the cell 10. For example, when the node A is at logic 1 and the node B is at logic 0, then the cell 10 is storing a logic 1. Conversely, when the node A is at logic 0 and the node B is at logic 1, then the cell 10 is storing a logic 0. Thus, the cell 10 is bistable, i.e., the cell 10 can have one of two stable states, logic 1 or logic 0.

In operation during a read of the cell 10, a word-line WL, which is coupled to the gates of the transistors 12 and 14, is driven to a voltage approximately equal to Vcc to activate the transistors 12 and 14. For example purposes, assume that Vcc=logic 1=5V and Vss=logic 0=0V, and that at the beginning of the read, the cell 10 is storing a logic 0 such that the voltage level at the node A is 0V and the voltage level at the node B is 5V. Also, assume that before the read cycle, the digit lines 16 and 18 are equilibrated to approximately Vcc–Vt. Therefore, the NMOS transistor 12 couples the node A to the digit line 16, and the NMOS transistor 14 couples the node B to the digit line 18. For example, assume that the threshold voltages of the transistors 12 and 14 are both 1V, then the transistor 14 couples a maximum of 4 V from the digit line 18 to the node B. The transistor 12, however, couples the digit line 16 to the node A, which pulls down the voltage on the digit line 16 enough (for example, 100–500 millivolts) to cause a sense amp (not shown) coupled to the lines 16 and 18 to read the cell 10 as storing a logic 0.

In operation during a write, for example, of a logic 1 to the cell 10, and making the same assumptions as discussed above for the read, the transistors 12 and 14 are activated as discussed above, and logic 1 is driven onto the digit line 16 and a logic 0 is driven onto the digit line 18. Thus, the transistor 12 couples 4 V (the 5 V on the digit line 16 minus the 1 V threshold of the transistor 12) to the node A, and the transistor 14 couples 0 V from the digit line 18 to the node B. The low voltage on the node B turns off the NMOS transistor 26, and turns on the PMOS transistor 28. Thus, the inactive NMOS transistor 26 allows the PMOS transistor 28 to pull the node A up to 5V. This high voltage on the node A turns on the NMOS transistor 22 and turns off the PMOS transistor 24, thus allowing the NMOS transistor 22 to reinforce the logic 0 on the node B. Likewise, if the voltage written to the node B is 4 V and that written to the node A is 0 V, the positive-feedback configuration ensures that the cell 10 will store a logic 0.

Because the PMOS transistors 24 and 28 have low on resistances (typically on the order of a few kilohms), they can pull the respective nodes A and B virtually all the way up to Vcc often in less than 10 nanoseconds (ns), and thus render the cell 10 relatively stable and allow the cell 10 to operate at a low supply voltage as discussed above. But unfortunately, the transistors 26 and 28 cause the cell 10 to be approximately 30%–40% larger than a 4-transistor (4-T) SRAM cell, which is discussed next.

FIG. 2 is a circuit diagram of a conventional 4-T SRAM cell 30, where elements common to FIGS. 1 and 2 are referenced with like numerals. A major difference between the 6-T cell 10 and the 4-T cell 30 is that the PMOS pull-up transistors 24 and 28 of the 6-T cell 10 are replaced with conventional passive loads 32 and 34, respectively. For example, the loads 32 ad 34 are often polysilicon resistors. Otherwise the topologies of the 6-T cell 10 and the 4-T cell 30 are the same. Furthermore, the 4-T cell 30 operates similarly to the 6-T cell 10. Because the loads 32 and 34 are usually built in another level above the access transistors 12 and 14 and the NMOS pull-down transistors 22 and 26, the 4-T cell 30 usually occupies much less area than the 6-T cell 10.

Additional, complex steps are required to form the load elements 32 and 34 such that 4-T cells present the usual complexity versus cost tradeoff. The high resistance values of the loads 32 and 34 can substantially lower the stability margin of the cell 30 as compared with the cell 10. Thus, under certain conditions, the cell 30 can inadvertently become monostable or read unstable instead of bistable. Also, the cell 30 consumes more power than the cell 20 because there is always current flowing from Vcc to VSS through either the load 32 and the NMOS transistor 26 or the load 34 and the NMOS transistor 22. In contrast, current flow from Vcc to Vss in the cell 20 is always blocked by one of the NMOS/PMOS transistor pairs 22/24 and 26/28. Efforts to eliminate load elements 32 and 34 have lead to the development of a load-less four transistor SRAM cell as shown in FIG. 3.

FIG. 3 is a circuit diagram of a conventional load-less 4-T SRAM cell, where elements common to FIGS. 2 and 3 are referenced with like numerals. The difference between the load-less cell 36 and the cell 30 is the elimination of load elements 32 and 34 and the replacment of NMOS transistors 12 and 14 with PMOS transistors 38 and 40, respectively.

With the load-less 4-T SRAM cell of FIG. 3, like all SRAM cells, leakage currents and/or subthreshold currents are generated by transistors 22 and 26 when in the off state, and one will always be in the off state. To prevent the cell 36 from spontaneously changing state, the transistors 38 and 40 must source sufficient load current from the digit lines 16 and 18, respectively, to offset the leakage and subthreshold currents. The needed load current can vary over many orders of magnitude due to temperature and process variations. However, the load current cannot be too large because the cumulative (along the digit lines 16 and 18) load current needs to be significantly less than the cell current for proper noise margin for proper operation of the sense amps.

Wide temperature variations resulting from cold-data retention testing and burn-in testing are also causes of wide variations in leakage and subthreshold currents, thereby causing wide variations in the load current that must be sourced by transistors 38 and 40. Such testing, coupled with normal process variation, sense amp margin requirements, as well as yield requirements (e.g., read/write stability requirements, power consumption requirements, etc.) have made the manufacturing of load-less 4-T SRAM's a difficult matter.

SUMMARY OF THE PRESENT INVENTION

The present invention is directed generally to a bias generator used in conjunction with one of the word line or digit line to set the desired level of load current as a function of temperature (or test being performed) to satisfy the simultaneous constraints of yield, sense amp margin, and load current even during cold-data retention testing or burn-in.

The present invention is also directed to a method of modifying the level of current conducted by the access transistors of a load-less, four transistor memory cell when the access transistors are in an off state. The method is comprised of the step of generating a temperature dependent bias voltage and connecting that bias voltage to the gate terminals of the access transistors.

The present invention is also directed to a current-mirror-based bias generator for a load-less four transistor SRAM as well as associated methods of controlling or modifying the current conducted by the access transistors of such an SRAM. The present invention may be thought of as an adjustable temperature coefficient, bias generator that references, via a current mirror, a reference bank of SRAM cells. The bank of reference cells provides an indication of the necessary conduction characteristics (e.g., gate to source voltage) of the access transistors under various conditions. By applying a bias voltage to the word line the desired current is sourced from the digit line. The bank of reference SRAM cells inherently compensates for process variations. The adjustable temperature coefficient bias generator allows the current sourced by the digit lines to vary greatly as a result of temperature variations. Thus, the present invention compensates for both process variations and temperature variations. Those benefits, and others, will become apparent from the description of the preferred embodiment hereinbelow.

BRIEF DESCRIPTION OF THE DRAWINGS

For the present invention to be easily understood and readily practiced, the invention will now be described for purposes of illustration and not limitation, in conjunction with the following figures wherein.

DESCRIPTION OF THE PREFERRED EMBODIMENTS

Figure 1:
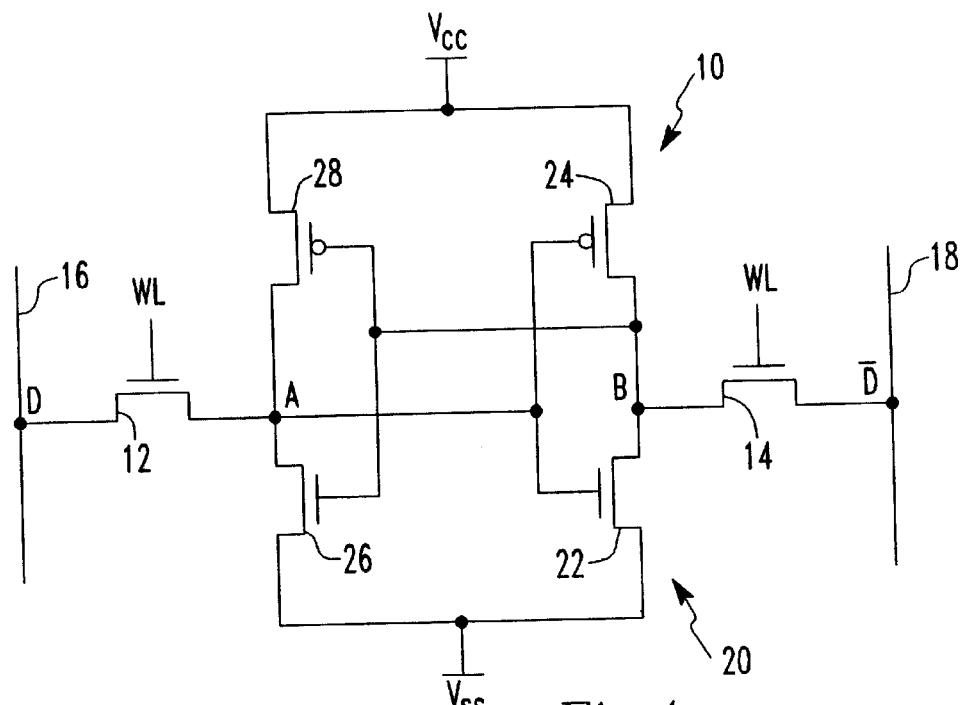
FIG. 1 is a circuit diagram of a conventional 6-T SRAM cell.
Figure 2:
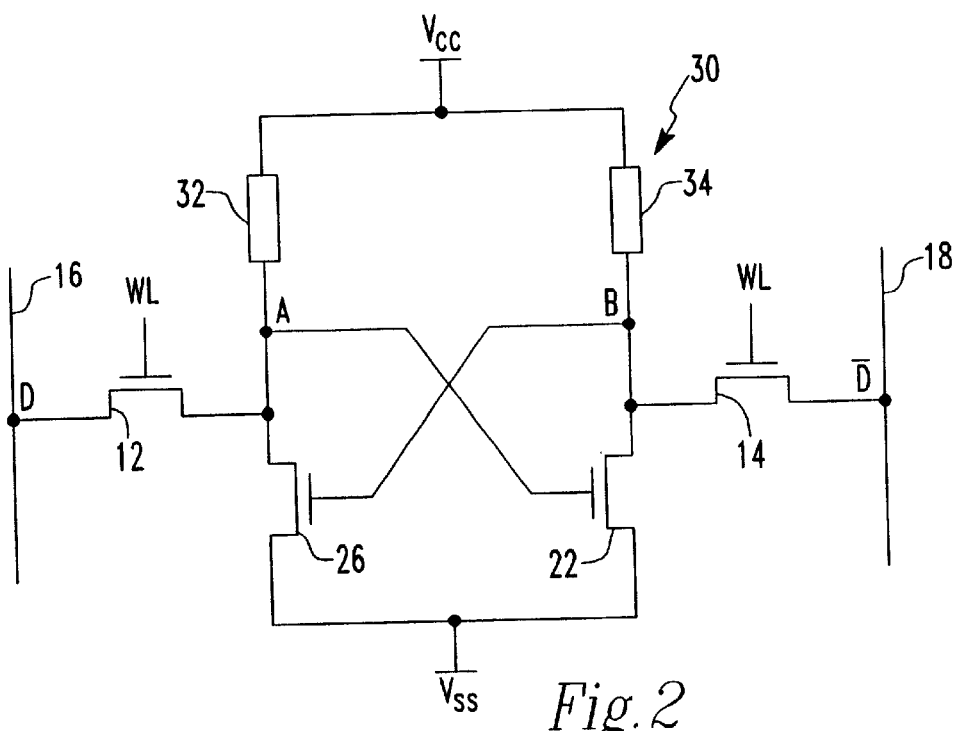
FIG. 2 is a circuit diagram of a conventional 4-T SRAM cell.
Figure 3:
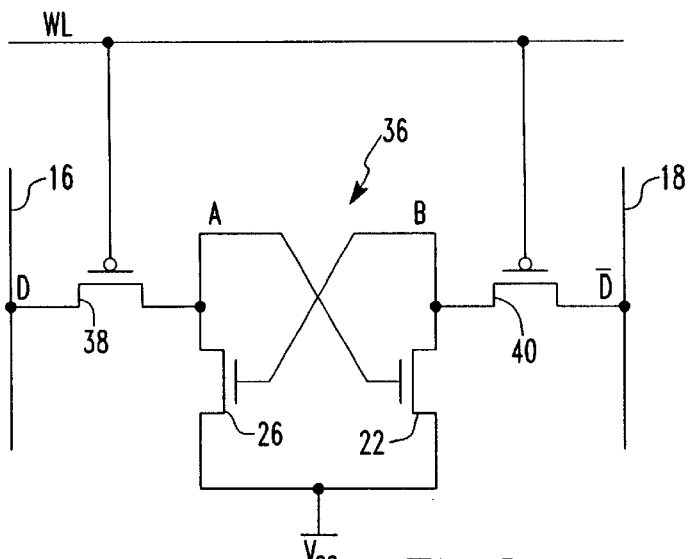
FIG. 3 is a circuit diagram of a conventional load-less 4-T SRAM cell.
Figure 4:
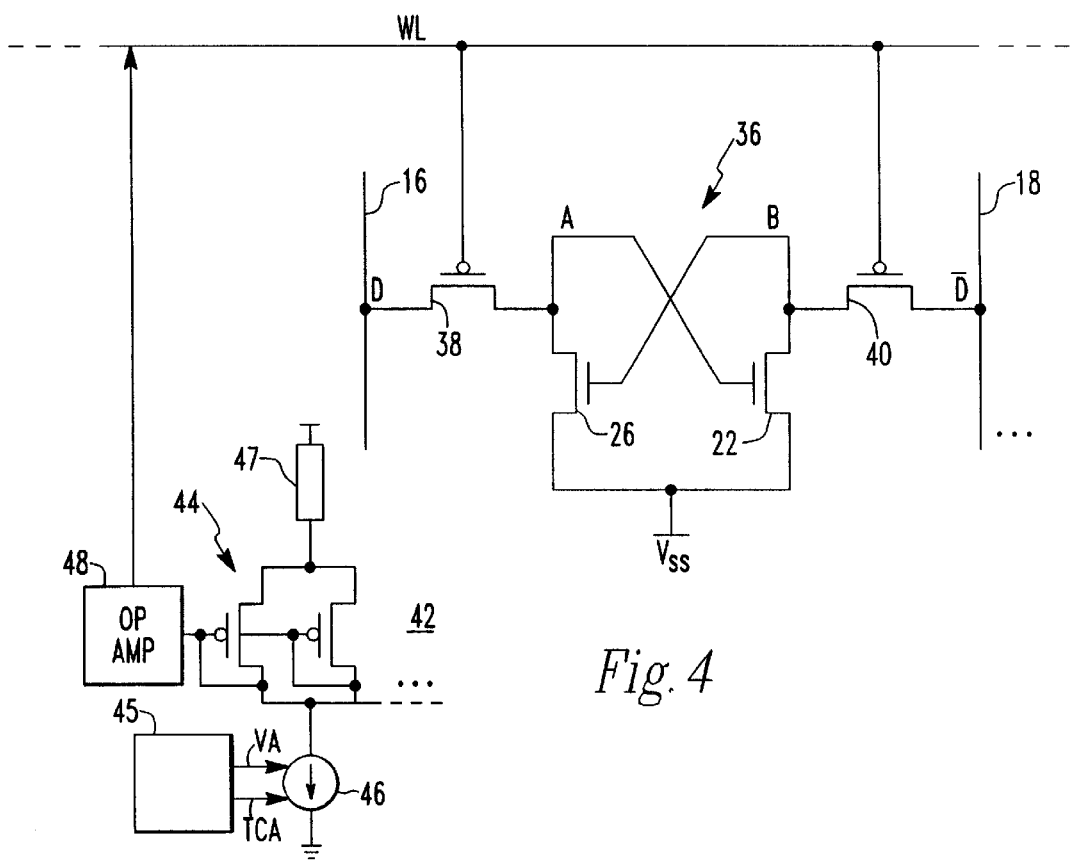
FIG. 4 is a circuit diagram of a load-less 4-T SRAM cell in conjunction with a bias generator constructed according to the teachings of the present invention.

FIG. 4 is circuit diagram of a load-less 4 transistor SRAM cell 36 in conjunction with a bias generator 42 constructed according to the teachings of the present invention. The cell 36 illustrated in FIG. 4 is identical to the cell 36 illustrated in FIG. 3. The bias generator 42 is comprised of a bank of transistors 44 connected in parallel with eachother and connected in series with a temperature dependent constant current source 46. The bank of transistors 44 is also connected in series to a voltage source through a trimmable resistor 47. The bank of transistors 44 is fabricated at the same time, and in the same manner, as access transistors 38 and 40. In that manner, the voltage drop from the gate terminal to the source terminal of each of the transistors 44 should be substantially the same as the gate to source terminal drop of access transistors 38 and 40. Thus, the voltage drop across the gate and source terminals of each of the transistors 44 is representative of the voltage drop across the gate and source terminals of the transistors 38 and 40. As an alternative to separately fabricating the bank of transistors 44, a bank of cells 36 could carry additional wiring so that the gate to source voltage of the access 38 and 40 can be sensed.

Returning to the bias generator 42, the current source 46 may be constructed using any known techniques which provide a temperature dependent constant current source. The constant current source will produce one value of current under, for example, cold data-retention test conditions, and another value of current under burn-in test conditions. Thus, for each value of current produced by the temperature dependent constant current source 46, a different voltage drop across the gate and source terminals of the transistors 44 is produced. That voltage drop is average and sensed by an operational amplifier 48. Although the bias generator 42 would operate if only one transistor for the bank of transistors 44 was provided, by providing a plurality of transistors within bank 44, a voltage drop which is more representative of the voltage drop experienced in the cells is produced. The voltage drop sensed by the operational amplifier 48 may then be applied to the word line which, as seen in the figure, is connected to the gate terminals of the access transistors 38 and 40. Thus, when the cell 36 is in the off-state, i.e., transistors 38 and 40 are nonconductive, the bias voltage applied by the operational amplifier 48 may be used to control the condition characteristics of the access 38 and 40 so as to enable the transistors 38 and 40 to source current from the digit lines 16 and 18. Because the bias voltage is directly related to the current which is produced by the constant current source 46, and the current is temperature dependent, the bias voltage is also temperature dependent. Thus, the conduction characteristics of the access transistors 38 and 40 are controlled according to the temperature such that the current required by the cell 36, for a given temperature, may be properly sourced.

The temperature dependent constant current source may receive inputs from a programmable device 45. The programmable device 45 may contain laser trimmable devices, fuses, or antifuses, which allow manipulation of a value adjust signal (VA) and a temperature coefficient adjust signal (TCA) to provide some degree of control over the bias voltage post fabrication.

Figure 5:
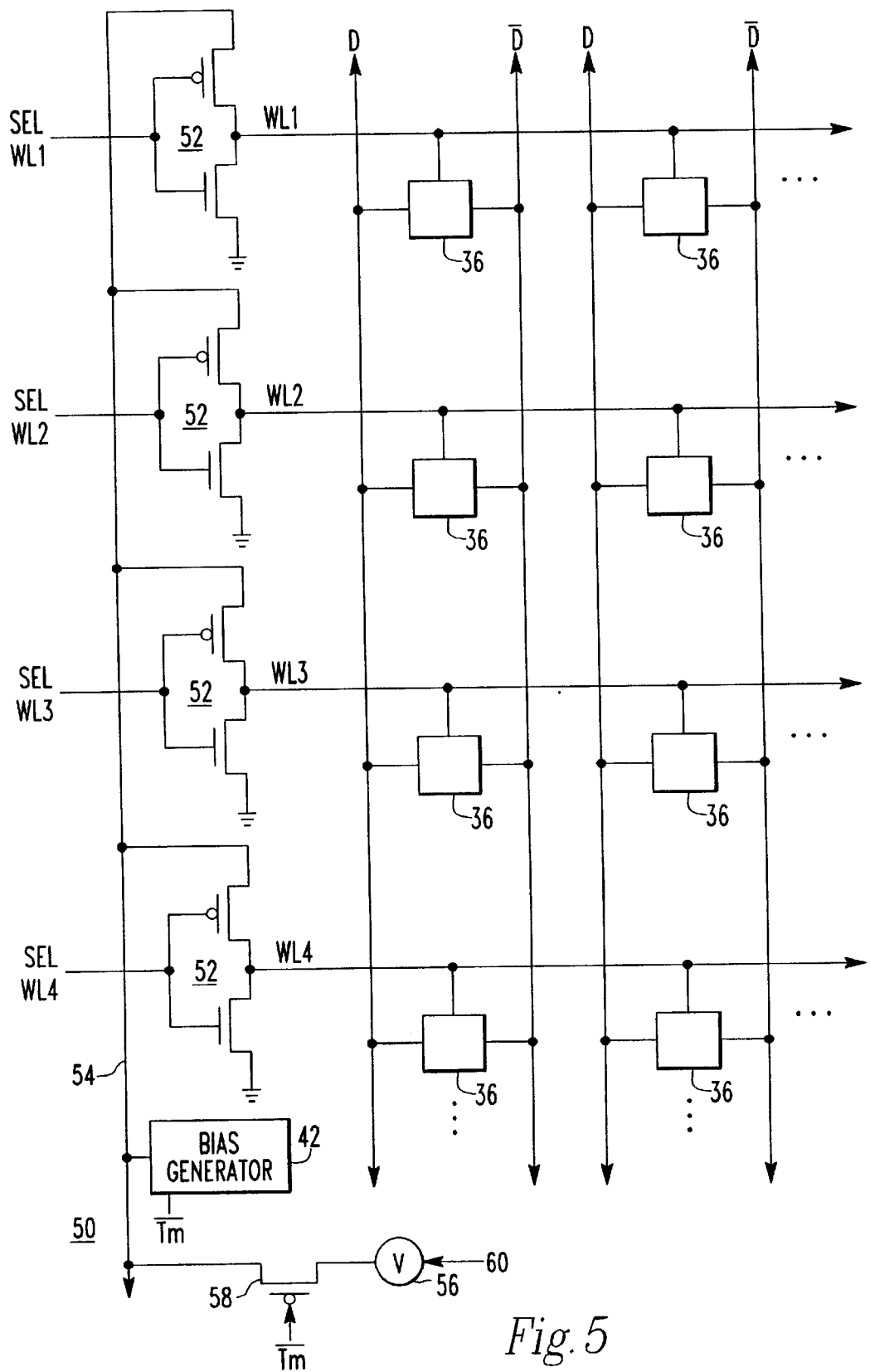
FIG. 5 is a block diagram of a portion of an array of 4-T SRAM cells incorporating the bias generator of the present invention.

FIG. 5 is a block diagram of a portion of an array 50 of four transistor SRAM cells 36 incorporating the bias generator 42 of the present invention. In FIG. 5, a plurality of digit lines D, $\overline{D}$, and a plurality of word lines WL1–WL4 are used to interconnect individual memory cells 36. The bias generator 42, constructed as shown in FIG. 4, globally provides the bias voltage to the array via global bus 54. The bias generator 42 may be coupled to each of the word lines WL1–WL4 through a transistor pair 52. Each transistor pair 52 is comprised of a PMOS and an NMOS transistor. The PMOS transistor may be connected between the bias generator 42 and a word line, e.g., WL1. The NMOS transistor may be connected between the word e.g. Sel WL1.

In operation, only one word line will be active at a time. For word lines not selected, the NMOS transistor of the transistor pair 52 will be off while the PMOS transistor will be on thereby coupling the bias voltage to each of the non-selected word lines. When a word line is selected, e.g., WL1, the word line select signal, e.g., Sel WL1, will cause the transistors to change state. Specifically, the NMOS transistor will turn on connecting the word line to ground thereby rendering the word line active while the PMOS transistor will turn off thereby ending the application of the bias voltage to the active word line.

To provide a particular voltage for a test mode, a voltage source 56 may be coupled to the global bus 54 through a transistor 58. The voltage source may be capable of outputting different voltages depending upon one or more control signals 60. Upon assertion of the signal $\overline{Tm}$, the bias generator 42 is disabled and the output of the voltage source 56 is applied to the global bus 54. Voltage source 56 may include a constant source as well as a laser trimmable device, fuses, or antifuses as discussed above for the purpose of giving the manufacturer some degree of control over the voltage(s) produced by the voltage source 56 post fabrication.

Figure 8:
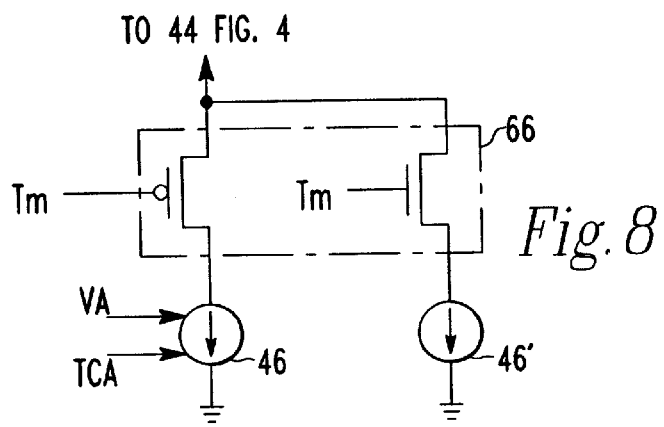
FIG. 8 illustrates another embodiment of the present invention.

Another way to implement the functionality described in the previous paragraph is through the use of more than one constant current source in the bias generator 42 as shown in FIG. 8. For example, a second constant current source 46' could be operatively connected through a switch 66 to the remainder of the circuit for producing a voltage input to op amp 48. The constant current source 46' is responsive to a particular test mode instead of being responsive to the temperature.

Figure 9:
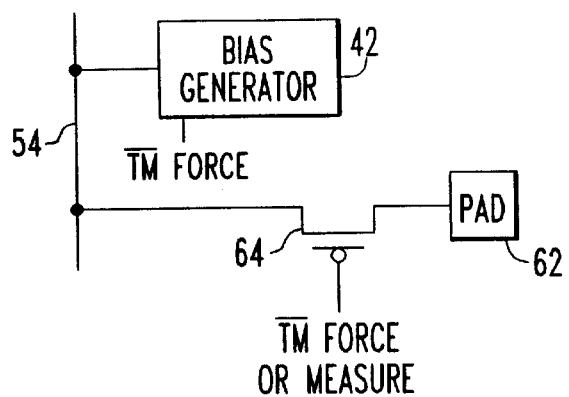
FIG. 9 is a block diagram illustrating how the bias voltage on the global bus can be forced to any value.

Another embodiment of the present invention is illustrated in FIG. 9. In FIG. 9, a pad 62 is connected to the global bus 54 through a transistor 64. Whenever the signal $\overline{Tm}$-force is asserted, the bias generator 42 is disabled and the voltage available at the pad 62 is placed on the global bus 54. Thus, the voltage on global bus 54 may be forced to any value. When the signal $\overline{Tm}$-measure is asserted, the voltage on bus 54 can be measured at pad 62. This functionality is useful for characterization purposes as well as yield and reliability screening.

Figure 6:
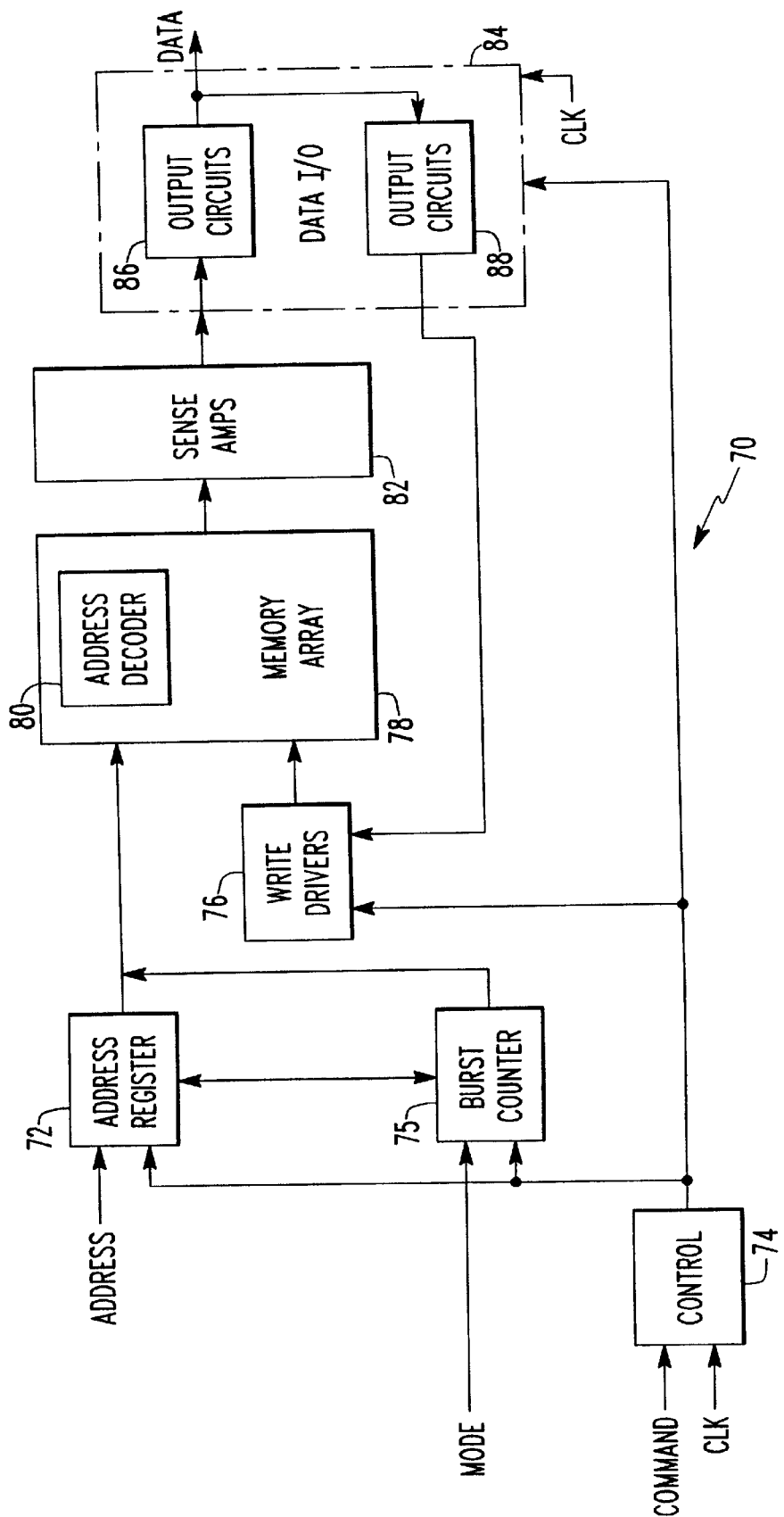
FIG. 6 is a block diagram of a load-less 4-T SRAM incorporating the bias generator of the present invention.

FIG. 6 is a block diagram of a memory circuit 70 which can include cells 36 and the bias generator 42 as previously described. In one embodiment, the memory circuit 70 way be a synchronous SRAM.

The memory circuit 70 includes an address register 72, which receives an address from an ADDRESS bus (not shown). A control logic circuit 74 receives a clock (CLK) signal, and receives enable and write signals on a COMMAND bus (not shown), and communicates with the other circuits of the memory circuit 70. A burst counter 75 causes the memory circuit 70 to operate a burst address mode in response to a MODE signal.

During a write cycle, write driver circuitry 76 writes date to a memory array 78. The array 78 is the component of the memory circuit 70 that can include the cells decoding the address from the address register 72. Alternately, the address decoder 80 may be separate from the array 78.

During a read cycle, sense amplifiers 82 amplify and provide the data read from the array 78 to a data input/output (I/O) circuit. The I/O circuit includes output circuits 86, which provide data from the sense amplifiers 82 to a DATA bus (not shown) during a read cycle. The I/O circuit 84 also includes input circuits 88, which provide data from the DATA bus to the write drivers 76 during a write cycle. The input and output circuits 88 and 86, respectively, may include conventional registers and buffers. Furthermore, the combination of the write driver circuitry 76 and the sense amplifiers 82 can be referred to as read/write circuitry. The various components shown in FIG. 6, with the exception of the array 78, constitute a plurality of components for reading information out of, and writing information into, the array 80.

Figure 7:
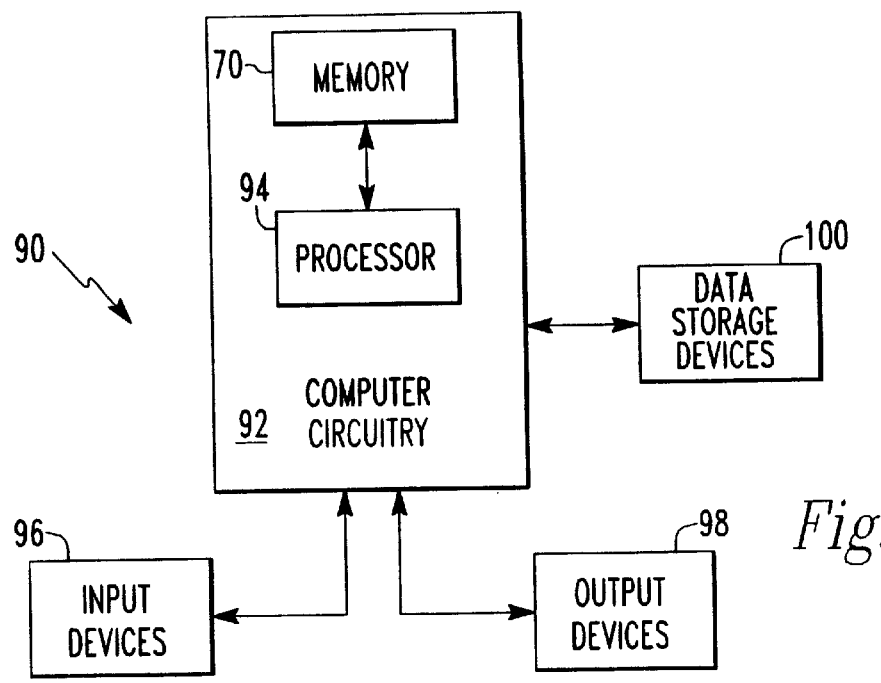
FIG. 7 is a block diagram of a computer system that includes the 4-T SRAM of FIG. 6.

FIG. 7 is a block diagram of an electronic system 90, such as a computer system, that incorporates the memory circuit 70 of FIG. 6. The system 90 includes computer circuitry 92 for performing computer functions, such as executing software to perform desired calculations and tasks. The circuitry 92 typically includes a processor 94 and the memory circuit 70, which is coupled to the processor 94. One or more input devices 96, such as a keyboard or a mouse, are coupled to the computer circuitry 92 and allow an operator (not shown) to manually input data thereto. One or more output devices 98 are coupled to the computer circuitry 92 to provide to the operator data generated by the computer circuitry 92. Examples of such output devices 98 include a printer and a video display unit. One or more data-storage devices 100 are coupled to the computer circuitry 92 to store data on or retrieve data from external storage media (not shown). Examples of the storage devices 100 and the corresponding storage media include drives that accept hard and floppy disks, tape cassettes, and compact disk read-only memories (CD-ROMs). Typically, the computer circuitry 92 includes address, data, and command buses and a clock line that are respectively coupled to the ADDRESS, DATA and COMMAND buses, and the CLK line of the memory circuit 70.

The present invention is also directed to a method of controlling the load current in a load-less four transistor memory cell. The method is comprised of the step of providing a temperature dependent bias voltage to one of the word line or the digit line. The providing step may be comprised of the steps of generating a temperature dependent constant current, generating a voltage drop across two terminals of a transistor representative of the transistors in the memory cell with the temperature dependent constant current, and sensing the voltage drop to produce the bias voltage. The voltage drop may be generated across a plurality of transistors to provide an average value for the voltage drop. By connecting or applying the bias voltage to one of the word line or digit line, the conduction of the access transistors of the memory cell may be controlled. However, because of the different function which the digit line performs in the context of a memory cell, it is considered preferable to apply the bias voltage to the word line. The present invention is also directed to a method of regulating a voltage difference between the word line and the digit line in a load-less four transistor memory cell by applying a temperature dependent bias voltage to one of the word line or the digit line.

While the present invention has been described in conjunction with preferred embodiments thereof, those of ordinary skill in the art will recognize that many modifications and variations are possible. For example, the type of transistors used to construct the cell may be varied such that the terminals in issue need not be the gate and source terminals. As previously mentioned, the same result can be achieved by varying the voltage on the digit line or, alternatively, controlling the voltage differential between the word line and the digit line. The foregoing disclosure and the following claims are intended to encompass all such modifications and variations.

What is claimed is:

1. A bias generator, comprising:
    a temperature dependent constant current source,
    a constant current source,
    a circuit for producing a bias voltage in response to one of said current sources; and
    a switch for connecting one of said constant current sources to said circuit.
2. The bias generator of claim 1 wherein said switch is responsive to a test mode signal.
3. The bias generator of claim 1 additionally comprising a laser trimmable device connected to said temperature dependent constant current source.
4. The bias generator of claim 1 additionally comprising a plurality of fuses connected to said temperature dependent constant current source.
5. The bias generator of claim 1 additionally comprising a plurality of antifuses connected to said temperature dependent constant current source.
6. The bias generator of claim 1 additionally comprising a laser trimmable device connected to said constant current source.
7. The bias generator of claim 1 additionally comprising a plurality of fuses connected to said constant current source.
8. The bias generator of claim 1 additionally comprising a plurality of antifuses connected to said constant current source.
9. A method, comprising:
    generating a temperature dependent constant current;
    generating a fixed constant current;
    selecting one of said temperature dependent and fixed constant currents;
    generating a plurality of voltage drops representative of the voltage drops across the gate and source terminals of access transistors in a loadless, four transistor cell using said selected constant current;
    averaging said voltage drops to produce an average voltage; and
    applying said average voltage to the gate terminals of the access transistors.
10. A bias generator, comprising:
    a temperature dependent constant current source;
    a constant current source;
    at least one transistor;
    a switch for connecting one of said constant current sources to said at least one transistor, and
    an amplifier responsive to a voltage across two terminals of said transistor to produce a bias voltage.
11. The bias generator of claim 10 wherein said switch is responsive to a test mode signal.
12. The bias generator of claim 10 additionally comprising a laser trimmable device connected to said temperature dependent constant current source.
13. The bias generator of claim 10 additionally comprising a plurality of fuses connected to said temperature dependent constant current source.
14. The bias generator of claim 10 additionally comprising a plurality of antifuses connected to said temperature dependent constant current source.
15. The bias generator of claim 10 additionally comprising a laser trimmable device connected to said constant current source.
16. The bias generator of claim 10 additionally comprising a plurality of fuses connected to said constant current source.
17. The bias generator of claim 10 additionally comprising a plurality of antifuses connected to said constant current source.
18. A bias generator, comprising:
    a temperature dependent constant current source;
    a constant current source;
    a plurality of transistors connected in parallel with one another;
    a switch for connecting one of said constant current sources to said parallel connected transistors; and
    an amplifier responsive to an average voltage across two terminals of said plurality of transistors to produce a bias voltage.
19. The bias generator of claim 18 wherein said average voltage across two terminals includes the average voltage across a gate terminal and a source terminal of each transistor in said plurality of transistors.
20. A combination, comprising:
    an array of memory cells;
    a plurality of digit lines and word lines interconnecting said array of memory cells; and
    a bias generator for providing a bias voltage to one of said word lines and digit lines, said bias generator comprising:
        a temperature dependent constant current source;
        a constant current source;
        a circuit for producing a bias voltage in response to one of said current sources; and
        a switch for connecting one of said constant current sources to said circuit.
21. A static random access memory, comprising:
    an array of memory cells each comprised of not more than four transistors;
    a plurality of digit lines and word lines interconnecting said array of memory cells;
    a plurality of peripheral devices, responsive to said digit lines and said word lines, for controlling the input of information to and output of information from said array of memory cells; and
    a bias generator for providing a bias voltage to one of said word lines and digit lines, said bias generator comprising:
        a temperature dependent constant current source;
        a constant current source;
        a circuit for producing a bias voltage in response to one of said current sources; and a switch for connecting one of said constant current sources to said circuit.

22. A system, comprising:

a microprocessor;

a plurality of memory devices in communication with said microprocessor, each of said memory devices comprising:
- an array of memory cells each comprised of not more than four transistors;
- a plurality of digit lines and word lines interconnecting said array of memory cells;
- a plurality of peripheral devices, responsive to said digit lines and said word lines, for controlling the input of information to and output of information from said array of memory cells; and
- a bias generator for providing a bias voltage to one of said word lines and digit lines, said bias generator comprising:
  - a temperature dependent constant current source;
  - a constant current source;
  - a circuit for producing a bias voltage in response to one of said current sources; and
  - a switch for connecting one of said constant current sources to said circuit.

23. A combination, comprising:

an array of memory cells;

a plurality of digit lines and word lines interconnecting said array of memory cells; and a bias generator for providing a bias voltage to one of said word lines and digit lines, said bias generator comprising:
- a temperature dependent constant current source;
- a constant current source;
- at least one transistor;
- a switch for connecting one of said constant current sources to said at least one transistor; and
- an amplifier responsive to a voltage across two terminals of said transistor to produce a bias voltage.

24. A static random access memory, comprising:

an array of memory cells each comprised of not more than four transistors;

a plurality of digit lines and word lines interconnecting said array of memory cells;

a plurality of peripheral devices, responsive to said digit lines and said word lines, for controlling the input of information to and output of information from said array of memory cells; and a bias generator for providing a bias voltage to one of said word lines and digit lines, said bias generator comprising:
- a temperature dependent constant current source;
- a constant current source;
- at least one transistor;
- a switch for connecting one of said constant current sources to said at least one transistor; and
- an amplifier responsive to a voltage across two terminals of said transistor to produce a bias voltage.

25. A system, comprising:

a microprocessor;

a plurality of memory devices in communication with said microprocessor, each of said memory devices comprising:
- an array of memory cells each comprised of not more than four transistors;
- a plurality of digit lines and word lines interconnecting said array of memory cells;
- a plurality of peripheral devices, responsive to said digit lines and said word lines, for controlling the input of information to and output of information from said array of memory cells; and
- a bias generator for providing a bias voltage to one of said word lines and digit lines, said bias generator comprising:
  - a temperature dependent constant current source;
  - a constant current source;
  - at least one transistor;
  - a switch for connecting one of said constant current sources to said at least one transistor; and
  - an amplifier responsive to a voltage across two terminals of said transistor to produce a bias voltage.

26. A combination, comprising:

an array of memory cells;

a plurality of digit lines and word lines interconnecting said array of memory cells; and a bias generator for providing a bias voltage to one of said word lines and digit lines, said bias generator comprising:
- a temperature dependent constant current source;
- a constant current source;
- a plurality of transistors connected in parallel with one another;
- a switch for connecting one of said constant current sources to said parallel connected transistors; and
- an amplifier responsive to an average voltage across two terminals of said plurality of transistors to produce a bias voltage.

27. A static random access memory, comprising:

an array of memory cells each comprised of not more than four transistors;

a plurality of digit lines and word lines interconnecting said array of memory cells;

a plurality of peripheral devices, responsive to said digit lines and said word lines, for controlling the input of information to and output of information from said array of memory cells; and a bias generator for providing a bias voltage to one of said word lines and digit lines, said bias generator comprising:
- a temperature dependent constant current source;
- a constant current source;
- a plurality of transistors connected in parallel with one another;
- a switch for connecting one of said constant current sources to said parallel connected transistors; and
- an amplifier responsive to an average voltage across two terminals of said plurality of transistors to produce a bias voltage.

28. A system, comprising:

a microprocessor;

a plurality of memory devices in communication with said microprocessor, each of said memory devices comprising:
- an array of memory cells each comprised of not more than four transistors;
- a plurality of digit lines and word lines interconnecting said array of memory cells;
- a plurality of peripheral devices, responsive to said digit lines and said word lines, for controlling the input of information to and output of information from said array of memory cells; and
- a bias generator for providing a bias voltage to one of said word lines and digit lines, said bias generator comprising:

a temperature dependent constant current source;

a constant current source;

a plurality of transistors connected in parallel with one another;

a switch for connecting one of said constant current sources to said parallel connected transistors; and an amplifier responsive to an average voltage across two terminals of said plurality of transistors to produce a bias voltage.

29. A method, comprising:

generating a temperature dependent constant current;

generating a fixed constant current;

selecting one of said temperature dependent and fixed constant currents;

generating a plurality of voltage drops representative of the voltage drops across the gate and source terminals of access transistors in a loadless, four transistor cell using said selected constant current;

averaging said voltage drops to produce an average voltage; and amplifying said average voltage to produce a bias voltage.

30. A method, comprising:

generating a temperature dependent constant current;

generating a fixed constant current;

selecting one of said temperature dependent and fixed constant currents;

generating at least one voltage drop representative of the voltage drops across the gate and source terminals of access transistors in a loadless, four transistor cell using said selected constant current; and amplifying said average voltage to produce a bias voltage.

31. The method of claim 30 additionally comprising the step of applying said bias voltage to the gate terminals of the access transistors.

* * * * *

UNITED STATES PATENT AND TRADEMARK OFFICE
CERTIFICATE OF CORRECTION

PATENT NO. : 6,330,195 B2
DATED : December 11, 2001
INVENTOR(S) : Ken W. Marr

It is certified that error appears in the above-identified patent and that said Letters Patent is hereby corrected as shown below:

<u>Title page,</u>
Following the phrase "now Pat. No. 6,198,670" add the following phrase
-- , issued March 6, 2001 --

<u>Column 1,</u>
Line 32, delete the word "pulldown" and insert in its place -- pull-down --

<u>Column 3,</u>
Line 11, delete the word "variation" and insert in its place -- variations --

<u>Column 4,</u>
Line 20, delete the word "eachother" and insert in its place -- each other --
Line 58, delete the word "condition" and insert in its place -- conduction --
Line 58, after the word "access" and before the digits "38" add the following word
-- transistors --

<u>Column 5,</u>
Line 20, after the word "word" and before the phrase "e.g. Sel WL1." insert the following phrase -- line, e.g. WL1, and ground. Each transistor is responsive to a word line select signal, --
Line 39, following the word "constant" and before the word "source" insert the following word -- current --
Line 66, delete the word "way" and insert in its place -- may --

UNITED STATES PATENT AND TRADEMARK OFFICE
CERTIFICATE OF CORRECTION

PATENT NO.    : 6,330,195 B2
DATED         : December 11, 2001
INVENTOR(S)   : Ken W. Marr It is certified that error appears in the above-identified patent and that said Letters Patent is hereby corrected as shown below:

<u>Column 6,</u>
Line 11, following the word "cells" and before the word "decoding" insert the phrase -- 36 and bias generator 42. The array 78 also includes an address decoder 80 for --
Line 16, following the word "circuit" insert the digits -- 84 --
Line 16, following the words "I/O circuit" and before the word "includes" insert the digits -- 84 --

Signed and Sealed this

Fourteenth Day of January, 2003

JAMES E. ROGAN
*Director of the United States Patent and Trademark Office*